United States Patent
Lu et al.

(10) Patent No.: US 11,543,851 B1
(45) Date of Patent: Jan. 3, 2023

(54) IMPEDANCE MEASUREMENT CIRCUIT AND IMPEDANCE MEASUREMENT METHOD THEREOF

(71) Applicant: Taiwan Semiconductor Manufacturing Company, Ltd., Hsinchu (TW)

(72) Inventors: Tsung-Che Lu, Hsinchu (TW); Chin-Ming Fu, Hsinchu County (TW); Chih-Hsien Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 17/351,248

(22) Filed: Jun. 18, 2021

(51) Int. Cl.
  *G01R 27/28* (2006.01)
  *G06F 1/10* (2006.01)
  *H03K 19/21* (2006.01)
  *G01R 27/02* (2006.01)
  *H03K 5/01* (2006.01)
  *H03K 5/00* (2006.01)

(52) U.S. Cl.
  CPC ............... *G06F 1/10* (2013.01); *G01R 27/02* (2013.01); *H03K 5/01* (2013.01); *H03K 19/21* (2013.01); *H03K 2005/00013* (2013.01)

(58) Field of Classification Search
  CPC . G06F 1/10; G01R 27/02; H03K 5/01; H03K 19/21; H03K 2005/00013
  USPC ........................................................ 324/649
  See application file for complete search history.

(56) References Cited

U.S. PATENT DOCUMENTS

| | | | |
|---|---|---|---|
| 2006/0167374 A1* | 7/2006 | Takehara | A61B 5/0537 600/547 |
| 2008/0303538 A1* | 12/2008 | Orr | G01R 15/005 324/707 |
| 2015/0038872 A1* | 2/2015 | Halter | A61B 5/0537 600/547 |
| 2021/0166046 A1* | 6/2021 | Maillard | G06V 40/1394 |
| 2021/0373056 A1* | 12/2021 | Lyden | G01R 27/16 |
| 2022/0233230 A1* | 7/2022 | Bogdanowicz | A61B 5/0538 |

* cited by examiner

*Primary Examiner* — Ryan Jager
(74) *Attorney, Agent, or Firm* — JCIPRNET (57) ABSTRACT

An impedance measurement circuit and an operating method thereof are provided. The impedance measurement circuit includes a current source, a voltage controlled oscillator (VCO), an operation circuit, and a first delay circuit. The current source, electrically connected to a power rail, is able to sink a current from the power rail according to the delayed clock signal. The VCO is configured to generate an oscillation signal according to a power voltage on the power rail. The operation circuit is electrically connected to the VCO and is configured to receive a sampling clock signal and the oscillation signal, sense the power voltage to generate a sampled signal, and accumulate the sampled signal to generate a measurement result. The first delay circuit, electrically connected to the current source and the operation circuit, is able to receive the sampling clock signal and transmit the delayed clock signal to the current source.

20 Claims, 10 Drawing Sheets

IMPEDANCE MEASUREMENT CIRCUIT AND IMPEDANCE MEASUREMENT METHOD THEREOF

BACKGROUND

Recently, high-performance computing (HPC) market is expected to become more popular and being widely used in advanced networking and server applications such as industrial internet of things (IIoT), and engineering applications especially for AI (artificial intelligence) related products that require high data rate, increasing bandwidth and for lowering latency. However, as the package size is getting larger for packages including the HPC component, communication between the dies and power consumption of the HPC circuit has become more challenging issues.

The HPC circuits usually consume large current to perform complicated calculations at high speeds, possess the ability to process large datasets, and generate huge power (or ground) bounce. To minimize development of common-mode currents within the silicon package of large current consuming circuits, a stable power delivery network (PDN) is required. Any bounce (noise) on either the power or 0V reference ground may cause simultaneously switching noise or signal integrity problems, as well as EMI. In addition, if power or ground bounce exceeds margin levels, components may not function. Accordingly, to ensure a stable PDN is a critical issue.

Power impedance measurement (PIM) or power monitoring circuits are required to ensure a robust PDN. However, timing issues in digital circuits will exist when a trigger time and a sampling time are too close. Besides, the area overhead due to extra sensing voltage controlled oscillator (VCO) remained to be settled.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The present disclosure provides various embodiments of methods and circuit to efficiently and accurately describe an equivalent-time sampling (ETS) of a power delivery network (hereinafter "PDN") of an IC design. As mentioned above, such power supply noise largely results from various voltage drops associated with respective circuit components of the IC design. In some embodiments, the disclosed systems and methods model each of various circuits of the IC design. More specifically, the disclosed systems and methods provide methods of time-domain sensing and frequency-domain sensing of the power voltage. As such, the power voltage drop associated with each circuit can be efficiently and accurately estimated.

Figure 1:
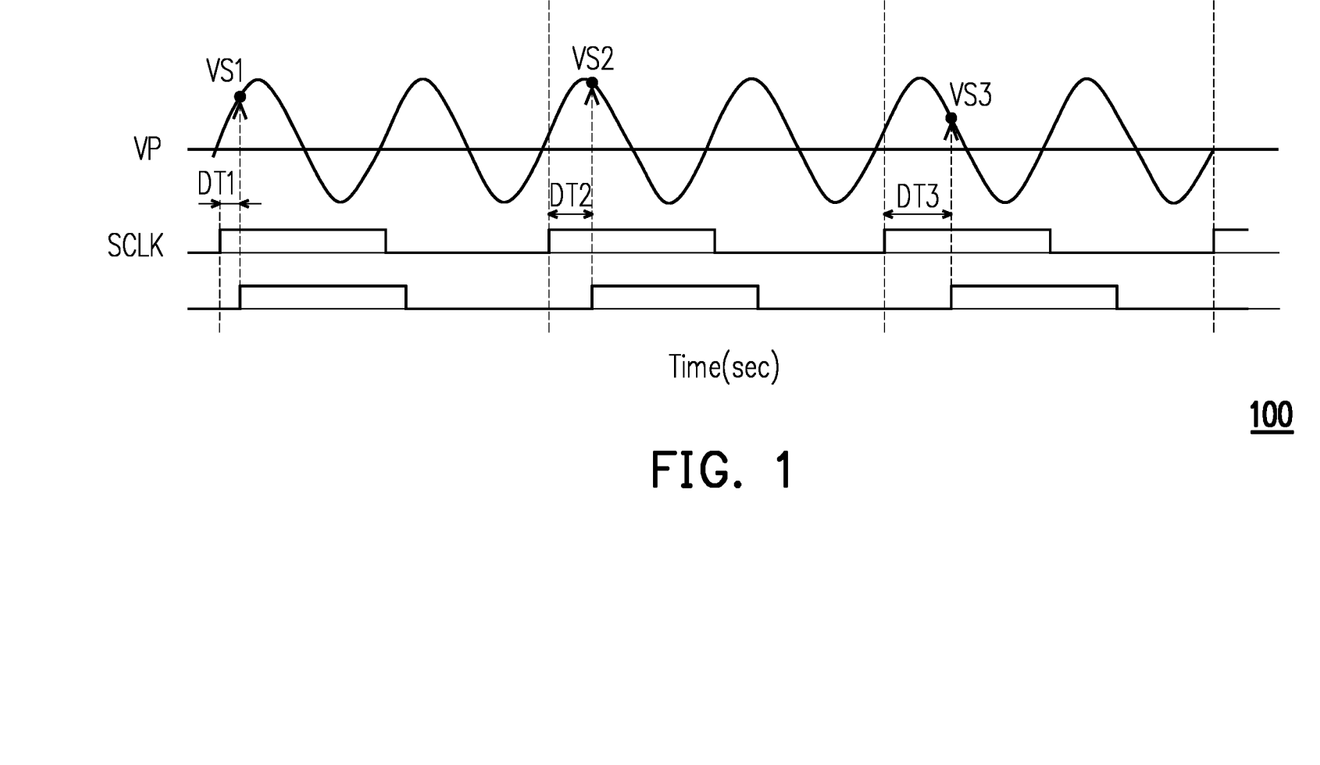
FIG. 1 is a timing diagram of power voltage and clock in accordance with some embodiments of the disclosure.

FIG. 1 is a timing diagram of power voltage and clock in accordance with some embodiments of the disclosure. Referring to FIG. 1, it is noted that a waveform 100 is merely an example, and is not intended to limit the present disclosure. Accordingly, it is understood that additional operations may be provided before, during, and after generating the waveform 100, and that some other operations may only be briefly described herein.

In presented embodiment, a power voltage VP, which may be periodic, stands for a voltage difference signal of PDN and a sampling clock signal SCLK is a clock signal which can be used to sample the power voltage VP. The points VS1, VS2, and VS3 on the VP waveform are a first sampling point, a second sampling point, and a third sampling point respectively. Since a sampling rate of the sampling clock signal SCLK is slower than a frequency of the power voltage VP, the sampling clock signal SCLK of lower frequency can be used to sample the power voltage VP several times to completely construct the voltage difference signal of power distribution network.

Referring to FIG. 1, a method of equivalent-time sampling (ETS) is used to construct an entire waveform of the power voltage VP by accumulating the sampling clock signal SCLK over many wave cycles. In ETS method, the power voltage VP is sampled over a number of cycles by the sampling clock signal SCLK repetitively. Moreover, a sequential sampling method of ETS can be used to capture an entire waveform and portions of real-time waveforms during multiple trigger events are acquired by introducing a small delay amount (for example, DT1, DT2, and DT3) sequentially. Over time, these portions are assembled into a complete waveform. To be specific, while using sequential sampling method of ETS, the sampling clock signal SCLK acquires one sampled signal from each trigger event, with a fixed interval delay amount between each acquisition.

In the present exemplary embodiment, the delay amount DT1 is 1 times a least significant bit (LSB) of a digital value of a period of the sampling clock signal SCLK. Herein, the delay amount DT2 is 2 times the LSB of the digital value of the period of the sampling clock signal SCLK, the delay amount DT3 is 3 times the LSB of the digital value of the period of the sampling clock signal SCLK. In the present exemplary embodiment, the delay amount DT1, DT2, and DT3 are variable values.

The sequential sampling method of ETS provides extremely high bandwidths (60 GHz and higher), higher timing resolution needed for telecommunications and device characterization needs, and accuracy as well, especially used for multiple-shot acquisitions and a repetitive waveform. Over time, the instrument accumulates enough sampled signal to reconstruct the waveform. This method guarantees the sample rate of the sampling clock signal SCLK that is slower than the power voltage VP to get all the sampling points required to accurately reconstruct the waveform.

Figure 2:
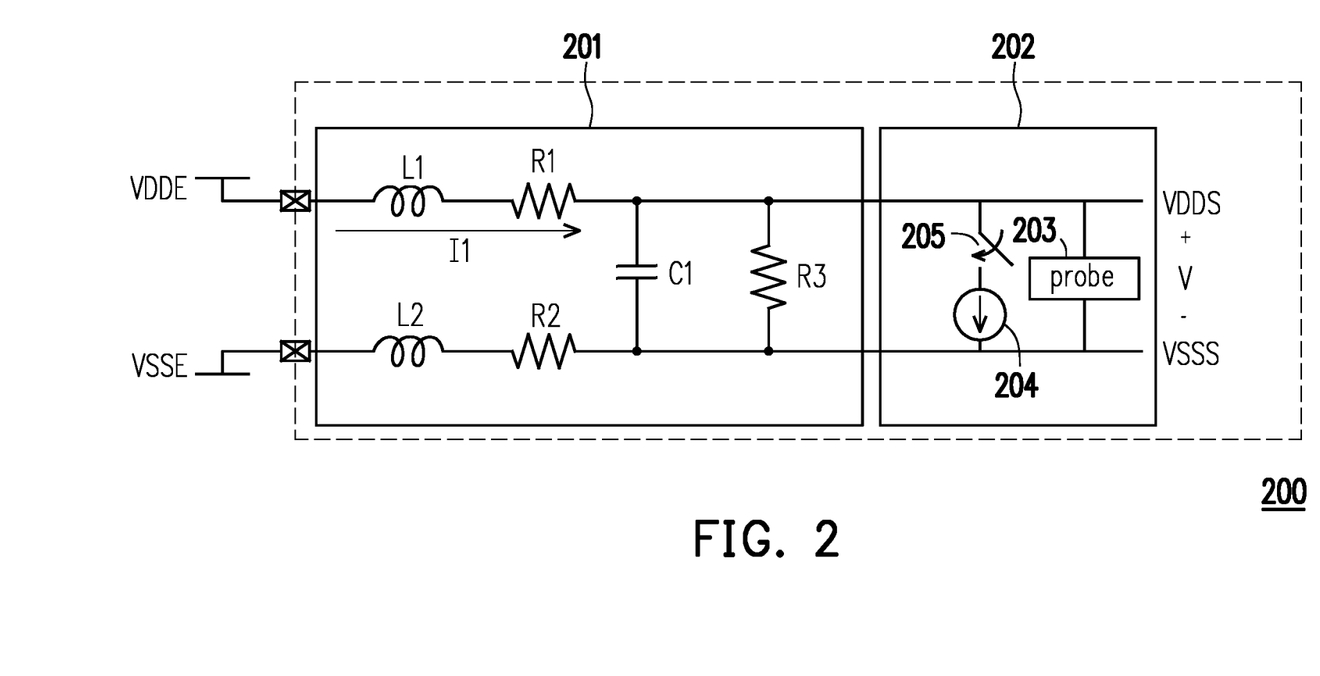
FIG. 2 illustrates an exemplary equivalent circuit diagram of a power distribution network (PDN) profile extraction in accordance with some other embodiments of the disclosure.

FIG. 2 illustrates an exemplary equivalent circuit diagram of the PDN profile extraction in accordance with some other embodiments of the disclosure. Referring to FIG. 2, an on-chip circuit 200 includes a PDN circuit 201 and a PIM built-in self-test (PIM BIST) circuit 202. In some embodiments, the on-chip circuit 200 can be used for both the input and output (I/O) power rails.

The PDN circuit 201 is electrically connected to the PIM BIST circuit 202. In the present exemplary embodiment, the PDN circuit 201 and the PIM BIST circuit 202 are shunt-connected.

Referring to FIG. 2, the PIM BIST circuit 202 of the present embodiment includes a probe 203, a current sink 204, and a switch 205. In some embodiments, the current sink 204 and the switch 205 are series-connected. In some embodiments, the probe 203 is shunt connected to one end of the switch 205 and another end of the current sink 204.

The PIM BIST circuit 202, which is used to extract the profile of the PDN circuit 201 and test whether the PDN circuit 201 is robust, has shown great promise in testing and is frequently used for mass testing. A voltage difference V between two ends of the probe 203 is generated by a difference of the internal power source VDDS and the internal ground source VSSS. The PDN circuit 201 is used to provide a voltage within regulation limits and with an acceptable noise to each active device.

In detail, the PDN circuit 201 of the present embodiment includes a capacitance C1, resistors R1-R3, and inductors L1 and L2. In this embodiment, the resistor R1 and the inductor L1 are series connected on a first power rail which is connected to an external power source VDDE. The resistor R2 and the inductor L2 are series connected on a second power rail which is connected to an external power source VSSE. The capacitor C1 is coupled between the first power rail and the second power rail, and the resistor R3 is coupled to the capacitor in parallel. In here, the capacitance C1, the resistors R1-R3, and the inductors L1 and L2 may be parasitic components.

The PDN circuit 201 of the present embodiment delivers a power generated by the external power source VDDE and the external ground source VSSE to all devices in an integrated circuit (hereinafter "IC"). In general, after a layout of the IC (and the PDN circuit 201) is designed, various subsequent testing steps are typically performed to verify the layout design work. The testing tools simulate the layout design by assuming that the PDN circuit 201 provides a constant voltage source to each circuit component of the IC. During real operations of the IC, each of elements in the IC may be associated with a voltage drop between the power rails. Such the voltage drop may be due to various parasitic components in the PDN circuit 201, such as the capacitance C1, the resistors R1-R3, and the inductors L1 and L2 may be parasitic components.

In some embodiments, the PDN circuit 201 of the on-chip circuit 200 provides an interconnection framework in which the switch 205 is allowed to control on/off state of the current sink 204. The external power source VDDE of the PDN circuit 201 may be bulky, thus interconnections are used. In some embodiments, the current I1 through components of the PDN circuit 201 creates a direct current (DC) drop and voltage fluctuations. In some embodiments, the PDN circuit 201 is used to regulate voltage for required current to be supplied over time. In some embodiments, the speed or the frequency at which the PDN circuit 201 operates determines the speed or the frequency at which charge can be supplied or removed from capacitors.

In the present exemplary embodiment, the on-chip circuit 200 is used to measure the power impedance by extracting component profiles of the PDN circuit 201. The current sink 204 is used to produce a step response when the PDN circuit 201 is placed under a load condition. In some embodiments, the current sink 204 may include a fast current loop that detects a current gradually increasing and converging to a step value through a power switch (e.g., the switch 205). After receiving the step response, the voltage difference V can be measured by the PIM BIST circuit 202. In light of this, a model of the PDN circuit 201 can be extracted by using the voltage difference V.

Figure 3A:
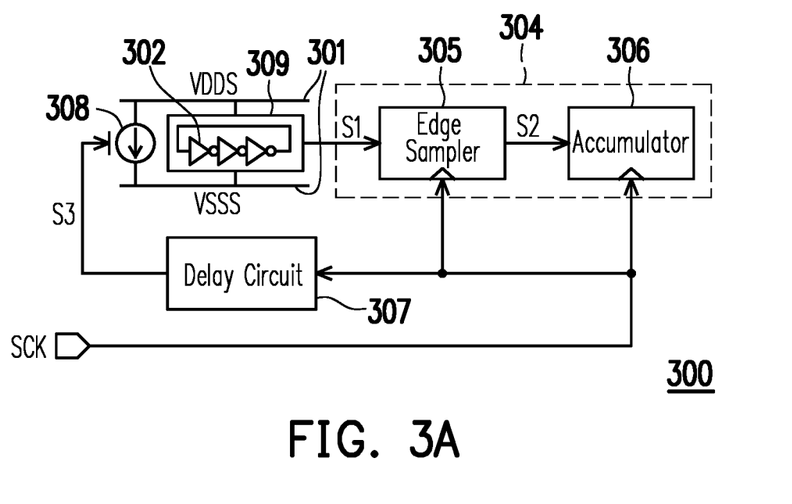
FIG. 3A illustrates an exemplary equivalent circuit diagram of a method of time-domain sensing in accordance with some other embodiments of the disclosure.

FIG. 3A illustrates an exemplary equivalent circuit diagram of an impedance measurement circuit in accordance with some other embodiments of the disclosure. According to the embodiments of this invention, FIG. 3A is the exemplary equivalent circuit diagram showing the time-domain sensing method to measure a power impedance. The impedance measurement circuit 300 includes a current source 308, a voltage controlled oscillator (hereinafter "VCO") 309, an operation circuit 304, and a first delay circuit 307. In some embodiments, the operation circuit 304 includes an edge sampler 305 and an accumulator 306.

Referring to FIG. 3A, the current source 308, which is electrically connected to power rails 301, provides a constant electric current flowing between the power rails 301. In this embodiment, the current source 308 sources a current from the internal power source VDDS to the internal power ground VSSS.

According to the embodiments of this invention, the operation circuit 304 in the impedance measurement circuit 300 is electrically connected to the VCO 309 and the first delay circuit 307. In addition, the operation circuit 304 in the impedance measurement circuit 300 can receive a sampling clock signal SCK and the oscillation signal S1 from the VCO 309. The VCO 309 is used to generate the oscillation signal S1 based on a variation of a power voltage VP of the external power source VDDE. Further, the operation circuit 304 is used to sense the power voltage VP of the external power source VDDE to generate a sampled signal S2 based on the sampling clock signal SCK. The operation circuit 304 is also used to accumulate the sampled signal S2 to generate a measurement result. The operation circuit 304 may also transmit the measurement result to peripheral circuits.

According to the embodiments of this invention, the first delay circuit 307 in the impedance measurement circuit 300 is coupled to the current source 308 and is electrically connected to the operation circuit 304. Thus the first delay circuit 307 in the impedance measurement circuit 300 can receive the sampling clock signal SCK and transmit a delayed clock signal S3 to be a trigger signal to the current source 308 based on the sampling clock signal SCK. The current source 308 can be used to sink the electric current between the power rails 301 according to the delayed clock signal S3. It is to be noted that, the delayed clock signal S3 from the first delay circuit 307 may be generated based on the received sampling clock signal SCK. The delayed clock signal S3 is generated based on the sampling clock signal SCK. In some embodiments, the sampling clock signal SCK can be generated from any internal or external circuit of the impedance measurement circuit 300, and no more special limitation here.

In some embodiments, the operation circuit 304 incudes the edge sampler 305 and the accumulator 306. The edge sampler 305 is electrically connected to the VCO 309. The accumulator 306 is electrically connected to the edge sampler 305 and other peripheral circuits (e.g., digital signal processor, hereinafter "DSP"); however, the disclosure is not limited thereto.

The edge sampler 305 is able to receive the oscillation signal S1 from the VCO 309 and is able to generate the sampled signal S2 based on the sampling clock signal SCK. Furthermore, the edge sampler 305 is used to periodically sense the power voltage VP on the power rail 301. The accumulator 306 is used to receive the sampled signal S2 from the edge sampler 305 and generate the measurement result based on the sampling clock signal SCK. It is to be noted that, the edge sampler 305 and the accumulator 306 are integrated and unified to the first delay circuit 307. Consequently, both of the edge sampler 305 and the accumulator 306 are operated based on the same sampling clock signal SCK. Thereafter, a total timing constraint (e.g., a total timing budget) of the impedance measurement circuit 300 is able to be relaxed.

In additional, in presented embodiment, the VCO 309 in the impedance measurement circuit 300 may be a ring oscillator circuit. In another embodiment, the VCO 309 may be any type of voltage control oscillation circuit well known by a person skilled in this art.

Figure 3B:
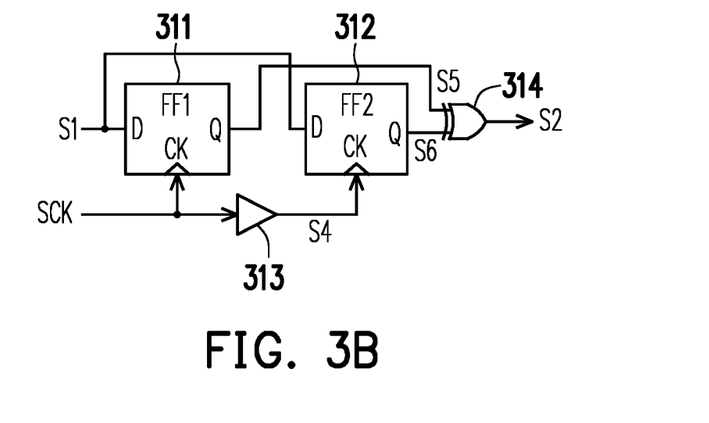
FIG. 3B illustrates an exemplary equivalent circuit diagram of an edge sampler of FIG. 3A in accordance with some other embodiments of the disclosure.

FIG. 3B illustrates an exemplary equivalent circuit diagram of the edge sampler 305 of FIG. 3A in accordance with some other embodiments of the disclosure. Referring to FIG. 3B, the edge sampler 305 of the impedance measurement circuit 300 includes a first flip-flop FF1, a second flip-flop FF2, a delay buffer 313, and an XOR gate 314. The first flip-flop FF1 and the second flip-flop FF2 may be D flip-flops but not limit thereto.

According to the embodiments of this invention, the first flip-flop FF1 includes a clock end CK, a data end D, and an output end Q. Similarly, the second flip-flop FF2 includes a clock end CK, a data end D, and an output end Q. The data end D of the first flip-flop FF1 receives the oscillation signal S1 from the VCO 309, the clock end CK of the first flip-flop FF1 receives the sampling clock signal SCK, and the output end Q of the first flip-flop FF1 transmits a first signal S5 to the XOR gate 314. The clock end CK of the second flip-flop FF2 receives a delayed sampling clock signal S4 from the delay buffer 313, the data end D of the second flip-flop FF2 receives the oscillation signal S1 from the VCO 309, and the output end Q of the second flip-flop FF2 transmits a second signal S6 to the XOR gate 314. The delay buffer 313, electrically connected to the second flip-flop FF2, is used to apply a timing delay to the sampling clock signal SCK, generates and transmits the delayed sampling clock signal S4 to the clock end CK of the second flip-flop FF2. The XOR gate 314, electrically connected to the output end Q of the first flip-flop FF1 and the output end Q of the second flip-flop FF2, is used to receive the first signal S5 from the output end Q of the first flip-flop FF1 and the second signal S6 from the output end Q of the second flip-flop FF2. Accordingly, the XOR gate 314 is used to perform an XOR logic operation on the first signal S5 from the output end Q of the first flip-flop FF1 and the second signal S6 from the output end Q of the second flip-flop FF2 and thus to generate the sampled signal S2 to be an XOR operation result.

The XOR gate 314 is used to receive the first signal S5 and the second signal S6 and performs an XOR logic operation on the first signal S5 and the second signal S6 to generate the sampled signal S2.

In detail operation, the first flip-flop FF1 is used to sample oscillation signal S1 according to the sampling clock signal SCK to generate the first signal S5. The second flip-flop FF2 is used to sample oscillation signal S1 according to the delayed sampling clock signal S4 to generate the second signal S6. The XOR gate 314 generates the sampled signal S2 by comparing the first signal S5 and the second signal S6.

Figure 3C:
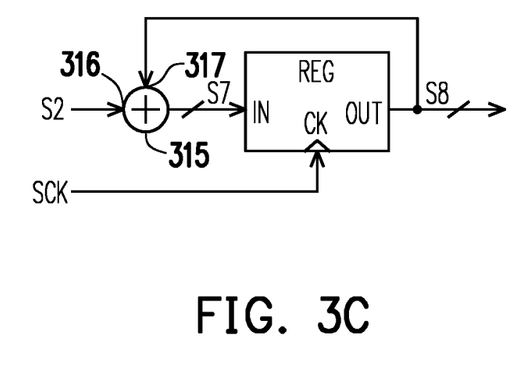
FIG. 3C illustrates an exemplary equivalent circuit diagram of an accumulator in accordance with some other embodiments of the disclosure.

FIG. 3C illustrates an exemplary equivalent circuit diagram of the accumulator 306 in accordance with some other embodiments of the disclosure. Referring to FIG. 3C, the accumulator 306 of the impedance measurement circuit 300 includes an adder 315 and a register REG. The adder 315 is electrically connected to the register REG.

According to the embodiments of this invention, the adder 315 has a first input end 316 and a second input end 317. The first input end 316 of the adder 315 is able to receive the sampled signal S2, the second input end 317 of the adder 315 is able to receive a feedback signal S8, and an output end of the adder 315 is able to generate a first operation signal S7. The register REG has the clock end CK, an input end IN, and an output end OUT. The clock end CK is able to receive the sampling clock signal SCK, the input end IN is able to receive the first operation signal S7, and the output end is able to generate the measurement result. In some embodiments, the register REG provides the measurement result to be the feedback signal S8.

The register REG of the accumulator 306 is used to temporarily store the operation result generated by the adder 315. The adder 315 may perform accumulating operation by adding the temporarily stored operation result with the feedback signal S8.

Figure 3D:
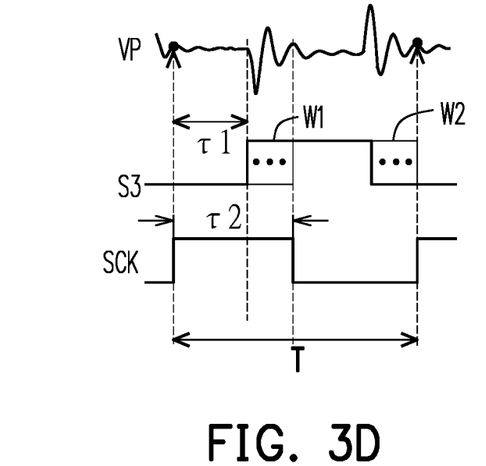
FIG. 3D is a timing diagram of signal sampling and triggering illustrating the method of time-domain sensing of FIG. 3A in accordance with some other embodiments of the disclosure.

FIG. 3D is a timing diagram of signal sampling and triggering 303 illustrating the time-domain sensing of FIG. 3A in accordance with some other embodiments of the disclosure. Referring to FIG. 3D, the power voltage VP is varied over time according to the delayed clock signal S3. The sampling clock signal SCK which is a periodical signal is transmitted to the edge sampler 305, the accumulator 306, and the first delay circuit 307. The sampling clock signal SCK has a period T. Accordingly, the operation circuit 304 is used to sense the power voltage VP and generate the measurement result of the power impedance circuit 300 based on the sampling clock signal SCK. Further, the first delay circuit 307 is used to generate the delayed clock signal S3 as the trigger signal of the current source 308 associated the received sampling clock signal SCK. In some embodiments, a timing of the delayed clock signal S3 lags behind the sampling clock signal SCK with a first delay time τ1. In FIG. 3D, the delayed clock signal S3 may have a plurality of waveforms with different delay amounts. In here, the waveform W1 has less delay amount τ1 than delay amount τ2 of the waveform W2. Further, as a delay time of the delayed clock signal S3 increases over time (e.g., from the first delay time τ1 to the second delay time τ2), the current source 308 sinks a current from the power voltage VP over time as well. Thus the operation circuit 304 can sense a complete signal of the power voltage VP of the PDN circuit 201 during the period T and generate the measurement result of the power impedance circuit 300. In some embodiments, the delay amount may be a fixed time interval or a variable time interval.

Figure 4:
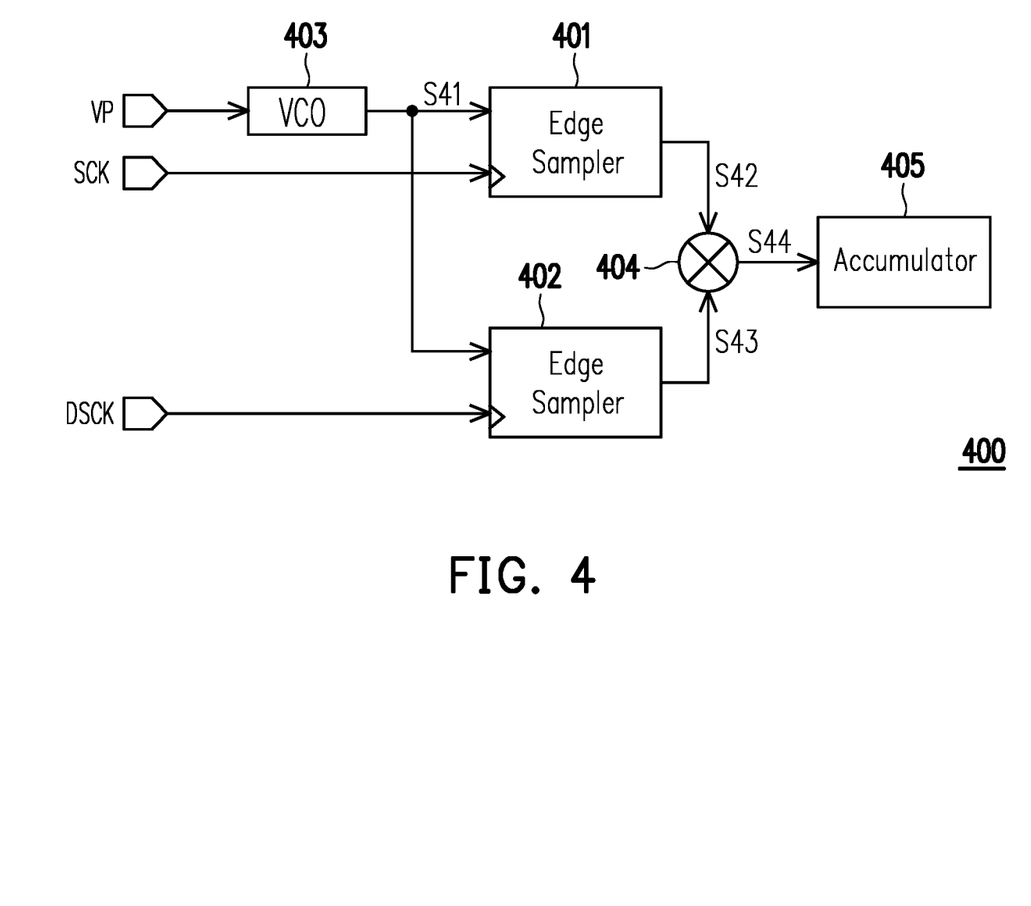
FIG. 4 illustrates an exemplary equivalent circuit diagram of a portion of the power impedance measurement (PIM) system in accordance with some embodiments of the present disclosure.

FIG. 4 illustrates an exemplary equivalent circuit diagram of a portion of impedance measurement circuit 400 in accordance with some embodiments of the present disclosure. Referring to FIG. 4, the impedance measurement circuit 400 includes a VCO 403, a first edge sampler 401, a second edge sampler 402, an operation circuit 404 and an accumulator 405. The VCO 403 is electrically connected to the first edge sampler 401 and the second edge sampler 402. The first edge sampler 401 and the second edge sampler 402 are electrically connected to the operation circuit 404 and the VCO 403. The accumulator 405 is electrically connected to the operation circuit 404. The accumulator 405 is also connected to a current sink, and the current sink is used to sink a current from a power rail. The power rail is used to transmit a power voltage VP.

According to the embodiments of this invention, the VCO 403 is used to sense the power voltage VP on the power rail to generate the oscillation signal S41. The VCO 403 is used to transmit the oscillation signal S41 to the first edge sampler 401 and the second edge sampler 402. The first edge sampler 401 receives the oscillation signal S41 from the VCO 403 and samples the oscillation signal S41 to provide a first sampled signal S42 based on the sampling clock signal SCK. Similarly, the second edge sampler 402 is used to receive the oscillation signal S41 from the same VCO 403 and sample the oscillation signal S41 to provide a second sampled signal S43 to the operation circuit 404 based on a delayed sampling clock signal DSCK. In some embodiments, the first edge sampler 401 and the second edge sampler 402 are able to sample a serial bit stream signal in a signal transition process for synchronization. In this embodiment, the impedance measurement circuit 400 is configured for frequency domain sensing.

According to the embodiments of this invention, the delayed sampling clock signal DSCK is generated by delaying the sampling clock signal SCK by a delayed amount. In certain embodiments, the delayed amount may be increased in a time sequence. In certain embodiments, the delay amount equals to an initial delay time plus an increasing value. In certain embodiments, the increasing value may be a variable value. In certain embodiments, the initial delay time is a non-negative value in a time-domain sensing scheme. In certain embodiments, the initial delay time is 10-100 times larger than that of a period of the oscillation signal S41. In certain embodiments, the increasing value is N times a least significant bit (LSB) of a period of the sampling clock signal, wherein N is a non-negative integer.

Based on above, in presented embodiment, merely one VCO 403 is needed.

In certain embodiments, the operation circuit 404 receives the first sampled signal S42 and the second sampled signal S43, and generates an operation result S44. Specifically, the operation circuit 404 may perform an exclusive-or (XOR) operation on the first sampled signal S42 and the second sampled signal S43 to generate the operation result S44. In detail, the operation circuit 404 compares the first sampled signal S42 and the second sampled signal S43 to generate the operation result S44.

The accumulator 405 is able to receive the operation result S44 from the operation circuit 404 and execute the accumulation operation to generate the measurement result. The current sink is able to receive a delayed output signal from the first delay circuit and generate the power voltage VP.

In certain embodiments, the VCO 403 is used to sense the power voltage VP from the power rail to generate the oscillation signal S41. The first edge sampler 401 samples the oscillation signal S41 to generate the first sampled signal S42 based on the sampling clock signal SCK. The second edge sampler 402 samples the oscillation signal S41 to generate the second sampled signal S43 based on the delayed sampling clock signal DSCK. The sampling clock signal SCK is delayed by the delayed amount to generate the delayed sampling clock signal DSCK, wherein the delayed amount may be increased in a time sequence. The operation circuit 404 generates the operation result S44 according to the first sampled signal S42 and the second sampled signal S43 by the logical operation. The accumulator 405 is used to accumulate the first sampled signal S42 or the operation result S43 to generate the measurement result. The current sink is able to sink the current from the power rail according to a delayed output signal from a delay circuit or a selected signal selected by a selector.

Figure 5A:
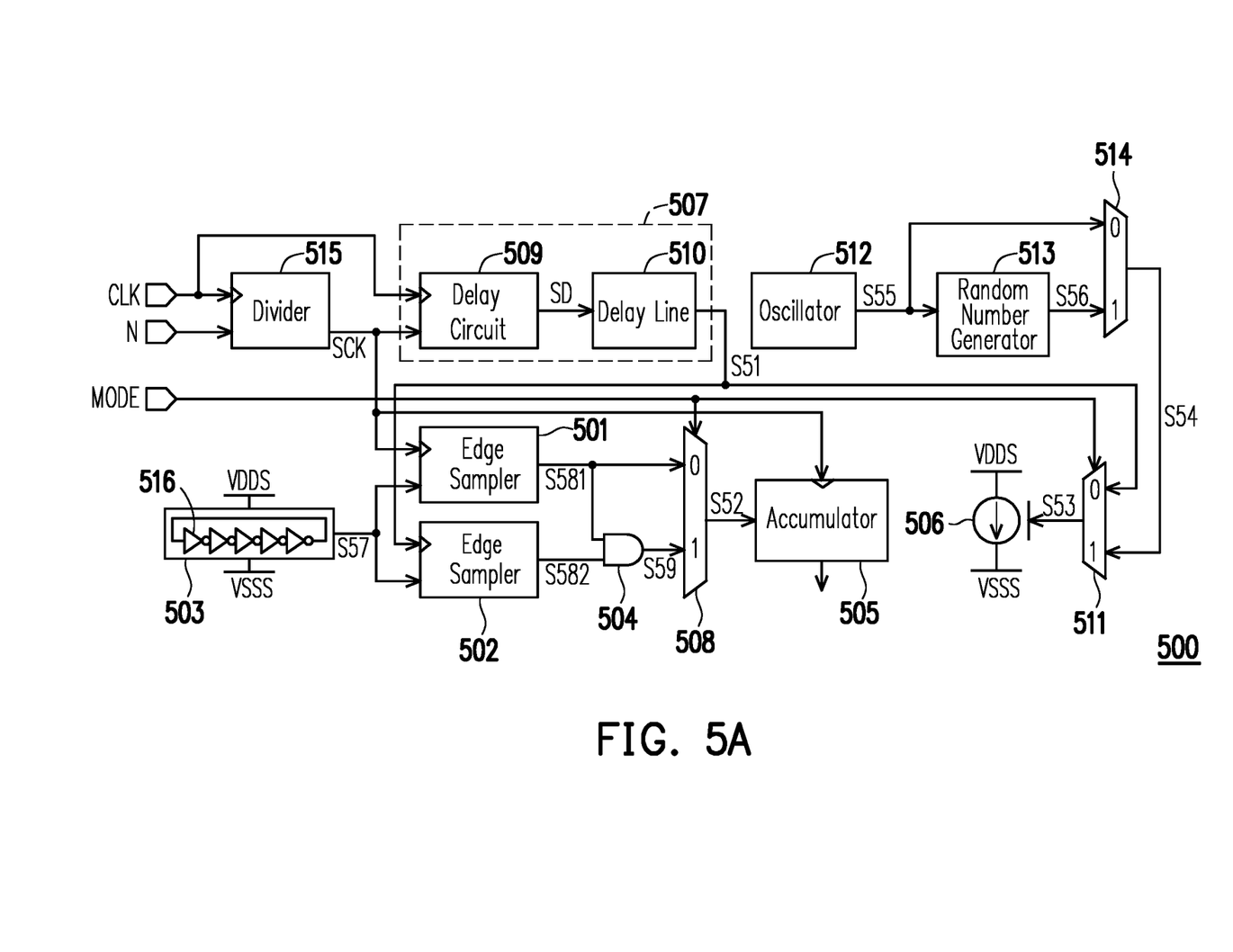
FIG. 5A illustrates an exemplary equivalent circuit diagram of a dual-mode PIM system in accordance with some embodiments of the present disclosure.

FIG. 5A illustrates an exemplary equivalent circuit diagram of a dual-mode impedance measurement circuit in accordance with some embodiments of the present disclosure. A dual-mode impedance measurement circuit 500 is configured to both execute time-domain and frequency-domain sensing in one system, thus the dual-mode impedance measurement circuit 500 is able to provide the flexibility and reducing the redundancy.

Referring to FIG. 5A, the impedance measurement circuit 500 includes the VCO 503, the first edge sampler 501, a second edge sampler 502, the operation circuit 504, the accumulator 505, a current sink 506, a first delay circuit 507, a first selector 508, a second selector 511, an oscillator 512, a random number generator 513, a third selector 514, and a divider 515. The first delay circuit 507, which includes a second delay circuit 509 and a delay line 510, is electrically connected to the divider 515, the first edge sampler 501, the second edge sampler 502, and the second selector 511. The first delay circuit 507 is used to receive the sampling clock signal SCK from the divider 515 and is used to generate and transmit a delayed output signal S51 based on a clock signal CLK to the second edge sampler 502 and the second selector 511. Further, the first delay circuit 507 is used to delay the clock signal CLK for generating a delayed output signal S51. The second delay circuit 509 of the first delay circuit 507 is electrically connected to the divider 515 and the delay line 510. Further, the second delay circuit 509 receives the sampling clock signal SCK and transmits a delayed sampling signal SD to the delay line 510 based on the clock signal CLK. In certain embodiments, the second delay circuit 509 could be a digital delay circuit. The delay line 510 of the first delay circuit 507 is electrically connected to the second delay circuit 509, the second edge sampler 502 and the second selector 511. Further, the delay line 510 receives the delayed sampling signal SD, generates the delayed output signal S51 and transmits the delayed output signal S51 to the second edge sampler 502 and the current sink 506. In certain embodiments, the delay line 510 could be a digital-controlled delay line (DCDL). In some embodiments, the delay line 510 may include multiple delay cells that subsequently delay the delayed sampling signal SD.

According to the embodiments of this invention, the first delay circuit 507 is used to be a delay counter which provides the total delay by virtue of counting the number of the clock period. In some embodiments, a total delay of the first delay circuit 507 is equal to the digital delay of the second delay circuit 509 plus the DCDL delay of the delay line 510. In some embodiments, the first delay circuit 507 has fast tuning capability under limiting phase noise. In one embodiment, the second delay circuit 509 is used to provide the coarse tuning digital delay and the delay line 510 is used to provide the fine tuning DCDL delay. The second delay circuit 509 provides the majority of the total delay of the first delay circuit 507 thus reducing tuning time of the total delay of the first delay circuit 507. In some embodiments, the delay line 510 is used to limit the tuning time sensitivity of the total delay of the first delay circuit 507. In some embodiments, the first delay circuit 507 is a hybrid delay generation scheme for reducing total area cost of the impedance measurement circuit 500.

The first selector 508 is electrically connected to the first edge sampler 501, the logic operation circuit 504, and the accumulator 505. Thus the first selector 508 is able to transmit a first selected signal S52 to the accumulator 505 according to a mode signal MODE. In some embodiments, the mode signal MODE is used to indicate that the impedance measurement circuit 500 is performed in a time domain sensing scheme or a frequency domain sensing scheme. In this embodiment, when the mode signal MODE is at a first logic level (i.e., MODE=0), the measurement circuit 500 is performed in the time domain sensing scheme, and when the mode signal MODE is at a second logic level (i.e., MODE=1) the measurement circuit 500 is performed in the frequency time domain sensing scheme. The second selector 511 is electrically connected to the first selector and the delay line 510 of the first delay circuit 507. As a consequence, the second selector 511 is able to receive the delayed output signal S51 generated by the delay line 510 and receive a third selected signal S54 outputted by the third selector 514, and is able to output one of the delayed output signal S51 and the third selected signal S54 as a second selected signal 53 to the current sink 506. The third selector 514 is electrically connected to the oscillator 512, the random number generator 513, and the second selector 511. Consequently, the third selector 514 is able to transmit the third selected signal S54 to the second selector 511 by selecting one of an emulated clock signal S55 of the oscillator 512 and a sequence number S56 generated by the random number generator 513.

The oscillator 512 is electrically connected to the random number generator 513 and the third selector 514. As a result, the oscillator 512 is able to transmit the emulated clock signal S55 to the random number generator 513 and the third selector 514. According to the embodiments of this invention, the oscillator 512, which is able to generate a periodical and synchronic signal, could be a clocking digital-controlled oscillator (DCO) that may be used as base clock input for next stage components. The clocking DCO is a well-known technique, and details thereof are not repeated herein. The random number generator 513 is electrically connected to the oscillator 512 and the third selector 514. Thus the random number generator 513 is able to receive the emulated clock signal S55 from the oscillator 512 and to generate the sequence number S56. The random number generator 513, which could be a pseudo random bit sequences (PRBS) generator, is commonly used in a data transceiver as a source for testing input signals. In some embodiments, the combination of the oscillator 512, the random number generator 513, and the third selector 514 could be used as device under test (DUT), and could be used to simulate the actual load of the dual-mode power measurement system 500.

The divider 515 is electrically connected to the second delay circuit 509 of the first delay circuit 507, the first edge sampler 501, and the accumulator 505. Further, the divider 515 is able to generate the sampling clock signal SCK by virtue of dividing the clock signal CLK according to a dividing number N. In certain embodiments, the divider 515 could be a programmable frequency divider which is generally applied to the frequency synthesizer, a multimode frequency divider and a clock generator, etc. In certain embodiments, the divider 515 is able to receive a high frequency signal generated by an oscillator, and generates a frequency-divided frequency to a counter (e.g., the first delay circuit 507) according to a dividing number N. In light of this, the counter counts the frequency-divided frequency to generate a corresponded output signal (e.g., the delayed output signal S51).

The first edge sampler 501 is electrically connected to the VCO 503, the second edge sampler 502, the first selector 508, the second selector 511, the divider 515, and the operation circuit 504. In addition, the first edge sampler 501 is able to receive the oscillation signal S57 generated by the ring oscillator circuit 516 from the VCO 503 and to transmit the first sampled signal S581 to the first selector 508 and the operation circuit 504 based on the sampling clock signal SCK from the divider 515. Similarly, the second edge sampler 502 is electrically connected to the VCO 503, the first edge sampler 501, the delay line 510, the second delay circuit 509, the accumulator 505, and the operation circuit 504. In addition, the second edge sampler 502 is able to receive the oscillation signal S57 from the VCO 503 and to transmit the second sampled signal S582 to the operation circuit 504 based on the delayed output signal S51.

In certain embodiments, the first selector 508 executes the time-domain waveform capturing and the frequency-domain waveform capturing when receiving the mode signal MODE at different logic level in the dual-mode impedance measurement circuit 500. Specifically, the first selector 508 is able to output the first selected signal S52 to the accumulator 505 by selecting one of the first sampled signal S581 from the first edge sampler 501 and the operation result S59 according to the logic operation executed by the operation circuit 504. As a consequence, the accumulator 505 is able to output the time-domain or the frequency-domain measurement result to the peripheral circuits. Specifically, the accumulator 505 is able to accumulate the first sampled signal S581 or the operation result S59 to generate the measurement result according to the mode signal MODE.

A step of accumulating the first sampled signal S581 or the operation result S59 by the accumulator 505 to generate the measurement result includes accumulating the first sampled signal S581 or the operation result S59 to generate the measurement result according to the mode signal MODE.

The VCO 516 is able to sense the power difference of the internal power source VDDS and the internal ground source VSSS on the power rail. In contrast, the current sink 506 is able to sink the power difference of the internal power source VDDS and the internal ground source VSSS on the power rail according to the second selected signal S53 outputted from the second selector 511 by selecting one of the delayed output signal S51 and the third selected signal S54. It is to be noted that, substantially, the VCO 516 and the current sink 506 are electrically connected to each other.

Figure 5B:
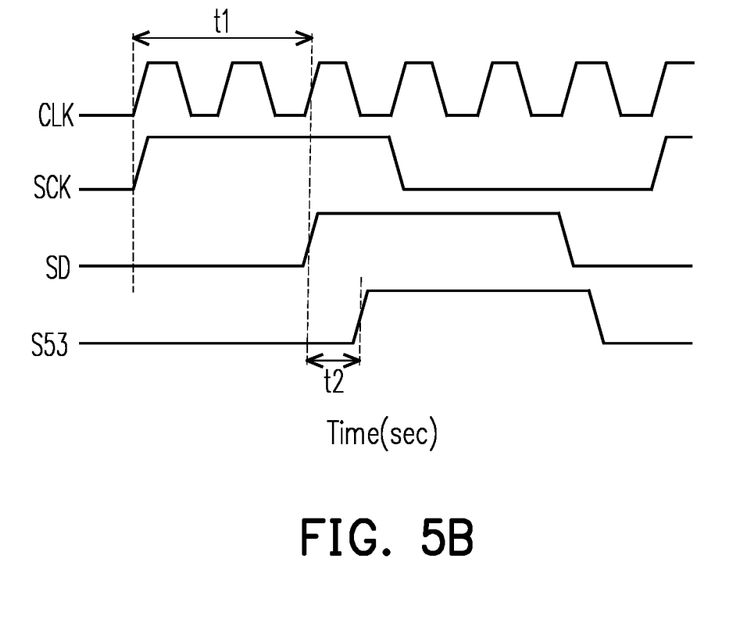
FIG. 5B is a timing diagram of the dual-mode PIM system of FIG. 5A in accordance with some other embodiments of the disclosure.

FIG. 5B is a timing diagram of the dual-mode impedance measurement circuit of FIG. 5A in accordance with some other embodiments of the disclosure. The horizontal axis refers to the time sequence with the time unit in seconds.

Referring to FIG. 5B, the timing diagram is under the condition wherein the mode signal MODE is at the first logic level (i.e., MODE=0) and the dividing number N is at six (i.e., N=6). As a result, the sampling clock signal SCK is generated by dividing the clock signal CLK by 6. The waveform of the sampling clock signal SCK shows the result of executing divide-by-six operation by the divider 614 (i.e., the sampling clock signal SCK with one cycle). The delayed sampling signal SD can be generated by delaying the sampling clock signal SCK according to a coarse-tuning delay τ1. The second selected signal S53 is generated by delaying the delayed sampling signal SD according to a fine-tuning delay is τ2.

Figure 5C:
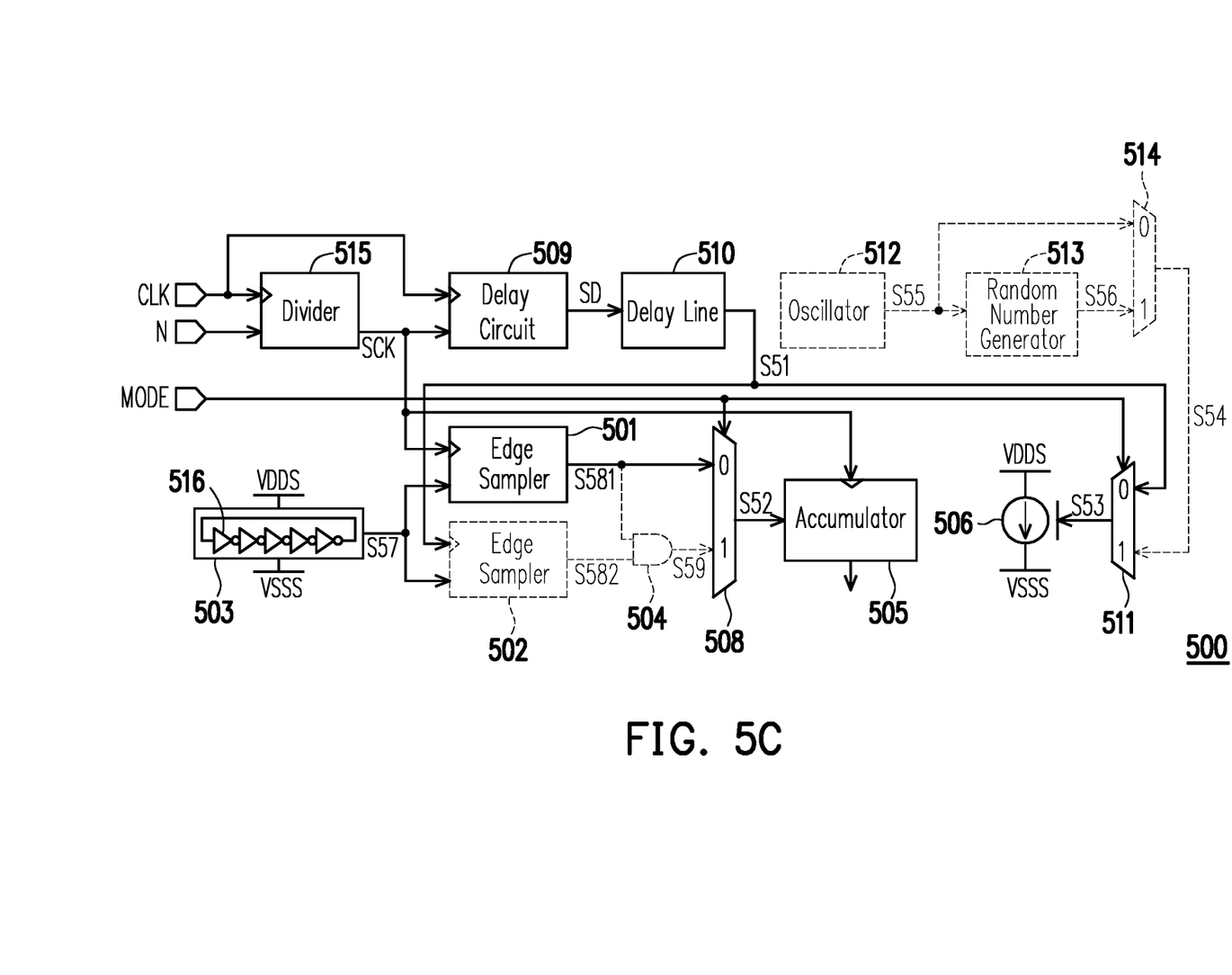
FIG. 5C illustrates an exemplary equivalent circuit diagram of the dual-mode impedance measurement circuit of FIG. 5A operated in a time-domain sensing scheme in accordance with some other embodiments of the disclosure.

FIG. 5C illustrates an exemplary equivalent circuit diagram of the dual-mode impedance measurement circuit of FIG. 5A operated in a time-domain sensing scheme in accordance with some other embodiments of the disclosure. The dual mode impedance measurement circuit 500 is used to perform a PDN impedance measurement by a time-domain sensing scheme.

Referring to FIG. 5C, during the time-domain sensing scheme, the component with dotted lines means no action is being performed (i.e., the second edge sampler 502, the operation circuit 504, the oscillator 512, the random number generator 513, the third selector 514); therefore, the signals of the corresponding components are not being transmitted or generated as well. Herein, the first selector 508 outputs the first selected signal S52 to the accumulator 505 when the mode signal MODE is directed to a time-domain sensing scheme. Further, the second selector 511 receives the delayed output signal S51 from the delay line 510 and outputs the second selected signal S53 to the current sink 506 when the mode signal MODE is at the first logic level (i.e., MODE=0). It is to be noted that the delayed output signal S51 from the delay line 510 is generated by delaying the delayed sampling signal SD from the second delay circuit 509. In certain embodiments, the time-domain waveform sensing scheme is used to relax a timing margin without sacrificing power, area, and measuring time (i.e., the time-domain sensing scheme for PDN impedance measurement is able to reduce area and power cost by avoiding additional compensations for relaxing the timing margin, thus the circuit complexity is able to be decreased).

The accumulator 505 is able to receive the first selected signal S52 and generate the measurement result based on the sampling clock signal SCK from the divider 515, wherein the divider 515 receives the dividing number N and generates the sampling clock signal SCK based on the clock signal CLK.

Referring to FIG. 5C, the VCO 503 is able to sense the power voltage (e.g., the internal power source VDDS and the internal ground source VSSS) from the power rail to generate the oscillation signal S57 based on the power voltage. The first edge sampler 501 is able to sample the oscillation signal S57 from the VCO 503 and to generate the first sampled signal S581 to the first selector 508 based on the delayed output signal S51.

Figure 5D:
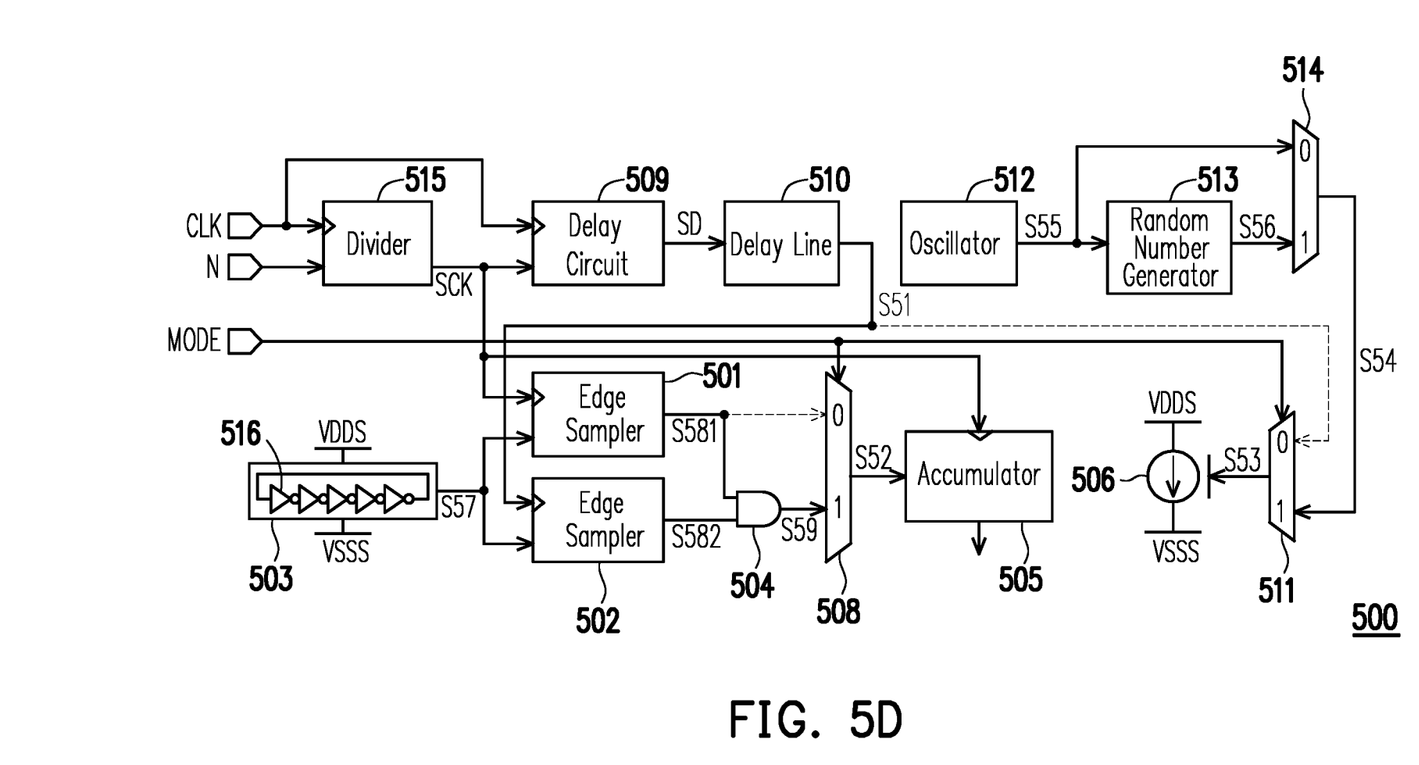
FIG. 5D illustrates an exemplary equivalent circuit diagram of the dual-mode impedance measurement circuit of FIG. 5A operated in a frequency-domain sensing scheme in accordance with some other embodiments of the disclosure.

FIG. 5D illustrates an exemplary equivalent circuit diagram of the dual-mode impedance measurement circuit of FIG. 5A operated in a frequency-domain sensing scheme in accordance with some other embodiments of the disclosure. The impedance measurement circuit 500 is used to perform the PDN impedance measurement by a frequency-domain sensing scheme.

During a frequency-domain sensing scheme, the component with dotted lines means no action is being performed; therefore, the signals of the corresponding components are not being transmitted or generated as well. Herein, the first selector 508 outputs the first selected signal S52 to the accumulator 505 when the mode signal MODE is directed to a frequency-domain sensing scheme. Further, the second selector 511 outputs the second selected signal S53 to the current sink 506 when the mode signal MODE is at the second logic level (i.e., MODE=1). It is to be noted that the delayed output signal S51 from the delay line 510 is generated by delaying the delayed sampling signal SD from the second delay circuit 509.

Referring to FIG. 5D, the VCO 503 is able to sense the power voltage (e.g., the internal power source VDDS and the internal ground source VSSS) from the power rail to generate the oscillation signal S57 based on the power voltage. The first edge sampler 501 is able to sample the oscillation signal S57 from the VCO 503 and to generate the first sampled signal S581 to the operation circuit 504 based on the sampling clock signal SCK. The second edge sampler 502 is able to sample the oscillation signal S57 from the VCO 503 and to generate the second sampled signal S582 to the operation circuit 504 based on the delayed output signal S51. As a result, the operation circuit 504 is able to generate the operation result S59 based on the first sampled signal S581 and the second sampled signal S582. In certain embodiments, the frequency-domain spectrum capturing method for PDN impedance measurement is able to reduce the total area cost by virtue of reducing 50% area of VCO 503.

Referring to FIG. 5D, the oscillator 511 is able to generate the emulated clock signal S55, the random number generator 513 is able to generate the randomized sequence number S56, and the third selector 514 is able to select the emulated clock signal S55 or the randomized sequence number S56 to generate the third selected signal S54.

The accumulator 505 is able to receive the first selected signal S52 and generate the measurement result based on the sampling clock signal SCK from the divider 514, wherein the divider 514 receives the dividing number N and generates the sampling clock signal SCK based on the clock signal CLK.

Figure 6:
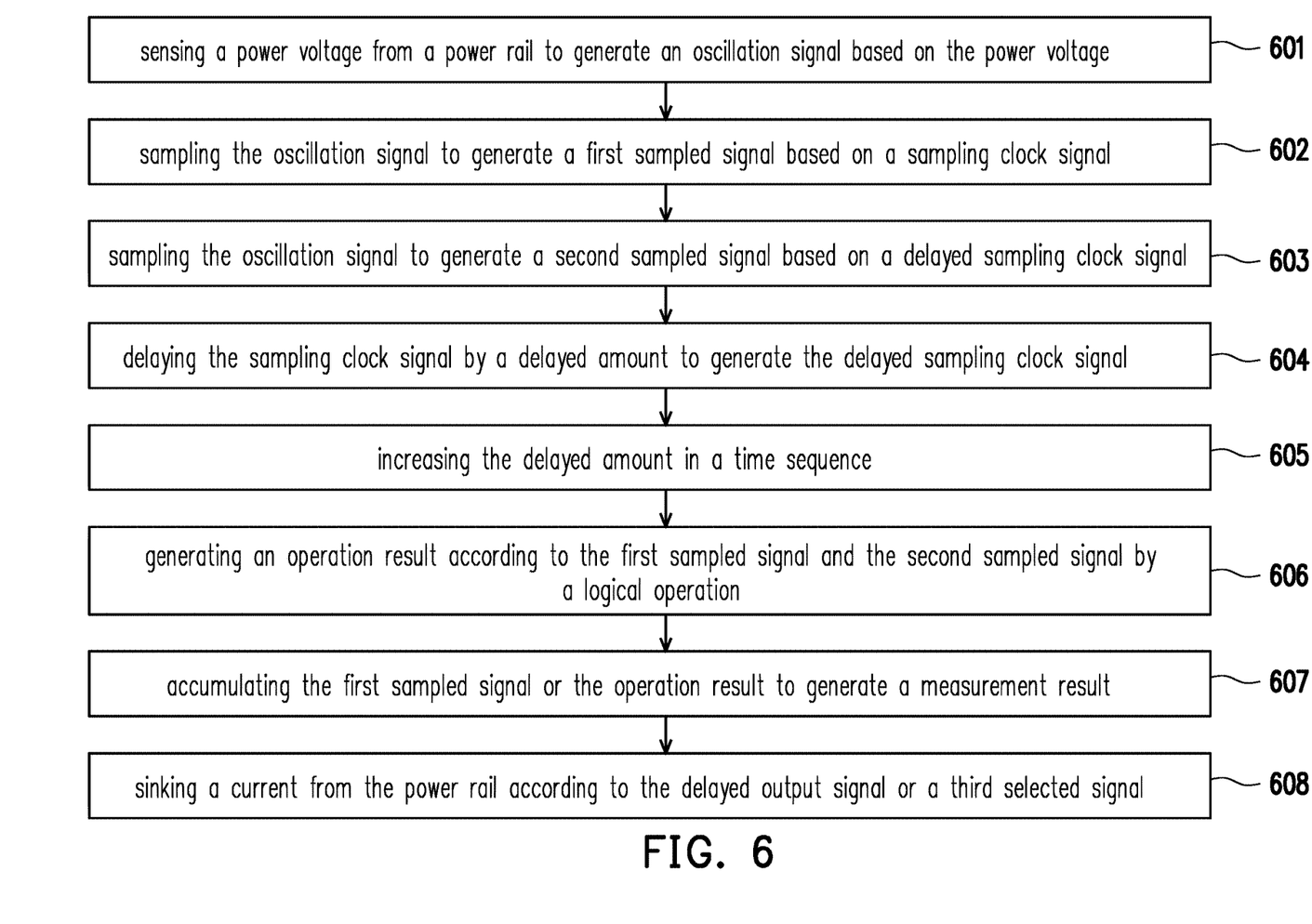
FIG. 6 illustrates a flow chart for an impedance measurement method according to an embodiment of present disclosure.

Please refer to FIG. 6, which illustrates a flow chart for an impedance measurement method according to an embodiment of present disclosure. In a step 601, a power voltage from a power rail is sensed to generate an oscillation signal based on the power voltage. In a step 602, the oscillation signal is sampled to generate a first sampled signal based on a sampling clock signal. In a step 603, the oscillation signal is sampled to generate a second sampled signal based on a delayed sampling clock signal, and in a step S604, the sampling clock signal is delayed by a delayed amount to generate the delayed sampling clock signal. Furthermore, in a step 605, the delayed amount can be increased in a time sequence. In a step 606, an operation result is generated according to the first sampled signal and the second sampled signal by a logical operation. In a step 607, the first sampled signal or the operation result is accumulated to generate a measurement result. In a 608, a current is sunk from the power rail according to the delayed output signal or a third selected signal.

The implementation details of the above steps have been described in detail in the aforementioned examples and implementation methods and not to be restated here.

According to some embodiments of the present disclosure, an impedance measurement circuit includes a current source, coupled to a power rail; a voltage controlled oscillator (VCO), generating an oscillation signal according to a power voltage on the power rail; an operation circuit, coupled to the VCO, receiving a sampling clock signal and the oscillation signal, sensing the power voltage to generate a sampled signal based on the sampling clock signal, and accumulating the sampled signal to generate a measurement result; and a first delay circuit, coupled to the current source and the operation circuit, receiving the sampling clock signal and generating a delayed clock signal, wherein the first delay circuit transmits the delayed clock signal to the current source, and the current source sinks a current from the power rail according to the delayed clock signal.

According to some embodiments of the present disclosure, an impedance measurement circuit, comprising: a voltage controlled oscillator (VCO), configured to sense a power voltage on a power rail to generate an oscillation signal according to the power voltage; a first edge sampler, coupled to the VCO, receiving the oscillation signal from the VCO, and sampling the oscillation signal to generate a first sampled signal based on a sampling clock signal; a second edge sampler, coupled to the VCO, receiving the oscillation signal from the VCO, and sampling the oscillation signal to generate a second sampled signal based on a delayed sampling clock signal, wherein the delayed sampling clock signal is generated by delaying the sampling clock signal by a delayed amount, wherein the delayed amount is increased in a time sequence; an operation circuit, coupled to the first edge sampler and the second edge sampler, receiving the first sampled signal and the second sampled signal, and generating an operation result; an accumulator, coupled to the operation circuit, receiving the operation result from the operation circuit, and accumulating the operation result to generate a measurement result; and a current sink, coupled to the power rail, receiving a delayed output signal and generating the power voltage.

According to some embodiments of the present disclosure, an impedance measurement method comprising: sensing a power voltage from a power rail to generate an oscillation signal based on the power voltage; sampling the oscillation signal to generate a first sampled signal based on a sampling clock signal; sampling the oscillation signal to generate a second sampled signal based on a delayed sampling clock signal; delaying the sampling clock signal by a delayed amount to generate the delayed sampling clock signal; increasing the delayed amount in a time sequence; generating an operation result according to the first sampled signal and the second sampled signal by a logical operation; accumulating the first sampled signal or the operation result to generate a measurement result; and sinking a current from the power rail according to the delayed output signal or a third selected signal.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. An impedance measurement circuit, comprising:
   a current source, coupled to a power rail;
   a voltage controlled oscillator (VCO), generating an oscillation signal according to a power voltage on the power rail;
   an operation circuit, coupled to the VCO, receiving a sampling clock signal and the oscillation signal, sensing the power voltage to generate a sampled signal based on the sampling clock signal, and accumulating the sampled signal to generate a measurement result; and
   a first delay circuit, coupled to the current source and the operation circuit, receiving the sampling clock signal and generating a delayed clock signal,
   wherein the first delay circuit transmits the delayed clock signal to the current source, and the current source sinks a current from the power rail according to the delayed clock signal.

2. The impedance measurement circuit of claim 1, wherein the operation circuit comprises:
an edge sampler, coupled to the VCO, receiving the oscillation signal, and generating the sampled signal based on the sampling clock signal; and
an accumulator, coupled to the edge sampler, accumulating the sampled signal to generate the measurement result.

3. The impedance measurement circuit of claim 2, wherein the edge sampler comprises:
a first flip-flop, having a clock end, a data end, and an output end, wherein the data end of the first flip-flop receives the oscillation signal, the clock end of the first flip-flop receives the sampling clock signal, the output end of the first flip-flop generates a first signal;
a second flip-flop, having a clock end, a data end couple to the data end of the first flip-flop, and an output end, wherein the clock end of the second flip-flop receives a delayed sampling clock signal, the data end of the second flip-flop receives the oscillation signal, and the output end of the second flip-flop generate a second signal;
a delay buffer, receiving the sampling clock signal and generating the delayed sampling clock signal; and
an XOR gate, receiving the first signal and the second signal, and outputs the sampled signal.

4. The impedance measurement circuit of claim 2, wherein the accumulator comprises:
an adder, having a first input end receiving the sampled signal, a second input end receiving a feedback signal, and an output end for generating a first operation signal; and
a register, having a clock end receiving the sampling clock signal, an input end receiving the first operation signal, and an output end for generating the measurement result,
wherein the register provides the measurement result to be the feedback signal.

5. The impedance measurement circuit of claim 1, wherein the edge sampler periodically senses the power voltage.

6. An impedance measurement circuit, comprising:
a voltage controlled oscillator (VCO), configured to sense a power voltage on a power rail to generate an oscillation signal according to the power voltage;
a first edge sampler, coupled to the VCO, receiving the oscillation signal from the VCO, and sampling the oscillation signal to generate a first sampled signal based on a sampling clock signal;
a second edge sampler, coupled to the VCO, receiving the oscillation signal from the VCO, and sampling the oscillation signal to generate a second sampled signal based on a delayed sampling clock signal,
wherein the delayed sampling clock signal is generated by delaying the sampling clock signal by a delayed amount,
wherein the delayed amount is increased in a time sequence;
an operation circuit, coupled to the first edge sampler and the second edge sampler, receiving the first sampled signal and the second sampled signal, and generating an operation result;
an accumulator, coupled to the operation circuit, receiving the operation result from the operation circuit, and accumulating the operation result to generate a measurement result; and
a current sink, coupled to the power rail, receiving a delayed output signal and generating the power voltage.

7. The impedance measurement circuit of claim 6, further comprising:
a first delay circuit, receiving the sampling clock signal, generating a delayed output signal based on the clock signal;
a first selector, coupled to the first edge sampler, the logic operation circuit, and the accumulator, transmitting a first selected signal to the accumulator according to a mode signal.

8. The impedance measurement circuit of claim 7, wherein the first delay circuit further comprises:
a second delay circuit, receiving the sampling clock signal, generating a delayed sampling signal based on the clock signal; and
a delay line, coupled to the second delay circuit and the second edge sampler, receiving the delayed sampling signal and transmitting the delayed output signal to the second edge sampler and the current sink.

9. The impedance measurement circuit of claim 7, further comprising:
a second selector, coupled to the first selector and the first delay circuit, wherein the second selector receives the delayed output signal and a third selected signal and outputs one of the delayed output signal and the third selected signal to the current sink.

10. The impedance measurement circuit of claim 9, further comprising:
an oscillator;
a random number generator, coupled to the oscillator, receiving an emulated clock signal from the oscillator and generating a sequence number; and
a third selector, coupled to the oscillator, random number generator, and the second selector, transmitting the third selected signal to the second selector by selecting one of the emulated clock signal of the oscillator and the sequence number.

11. The impedance measurement circuit of claim 6, further comprising:
a divider, coupled to the first edge sampler and the accumulator, dividing a clock signal based on a dividing number to generate the sampling clock signal.

12. The impedance measurement circuit of claim 6, wherein the operation circuit performs an exclusive-or operation on the first sampled signal and the second sampled signal to generate the operation result.

13. The impedance measurement circuit of claim 6, wherein the delay amount=an initial delay time+an increasing value, wherein the increasing value is a variable value.

14. The impedance measurement circuit of claim 13, wherein the initial delay time is a non-negative value in a time-domain sensing scheme and wherein the initial delay time is larger than 10~100 times of a period of the oscillation signal in a frequency-domain sensing scheme.

15. The impedance measurement circuit of claim 13, wherein the increasing value is N times a least significant bit (LSB) of a period of the sampling clock signal, wherein N is a non-negative integer.

16. The impedance measurement circuit of claim 9, wherein the first selector outputs the first selected signal to the accumulator when the mode signal is directed to a time-domain sensing scheme, wherein the second selector outputs the second selected signal to the current sink when the mode signal is at a first logic level.

17. The impedance measurement circuit of claim 16, wherein the first selector outputs the first selected signal to the accumulator when the mode signal is directed to a frequency-domain sensing scheme, wherein the second selector outputs the second selected signal to the current sink when the mode signal is at a second logic level.

18. An impedance measurement method comprising:
sensing a power voltage from a power rail to generate an oscillation signal based on the power voltage;
sampling the oscillation signal to generate a first sampled signal based on a sampling clock signal;
sampling the oscillation signal to generate a second sampled signal based on a delayed sampling clock signal;
delaying the sampling clock signal by a delayed amount to generate the delayed sampling clock signal;
increasing the delayed amount in a time sequence;
generating an operation result according to the first sampled signal and the second sampled signal by a logical operation;
accumulating the first sampled signal or the operation result to generate a measurement result; and
sinking a current from the power rail according to the delayed output signal or a third selected signal.

19. The impedance measurement method of claim 18, wherein a step of accumulating the first sampled signal or the operation result to generate the measurement result comprises:
accumulating the first sampled signal or the operation result to generate the measurement result according to a mode signal.

20. The impedance measurement method of claim 19, further comprising:
generating an emulated clock signal;
generating a randomized sequence number; and
selecting the emulated clock signal or the randomized sequence number to generate the third selected signal.

* * * * *